(12) United States Patent
Wakamatsu et al.

(10) Patent No.: US 7,556,529 B2
(45) Date of Patent: Jul. 7, 2009

(54) COAXIAL CONNECTOR AND MEASURING COAXIAL PROBE

(75) Inventors: Hiroki Wakamatsu, Ishikawa-gun (JP); Yuichi Maruyama, Kyoto (JP); Yoshihiro Osaki, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 11/873,115

(22) Filed: Oct. 16, 2007

(65) Prior Publication Data
US 2008/0044251 A1 Feb. 21, 2008

Related U.S. Application Data

(63) Continuation of application No. PCT/JP2006/311992, filed on Jun. 15, 2006.

(30) Foreign Application Priority Data
Jan. 13, 2006 (JP) .............................. 2006-005530

(51) Int. Cl.
*H01R 9/05* (2006.01)
(52) U.S. Cl. .................................... 439/578; 200/51 R
(58) Field of Classification Search ................ 200/51 R; 439/63, 578, 581, 582, 584, 585
See application file for complete search history.

(56) References Cited

U.S. PATENT DOCUMENTS

| | | | |
|---|---|---|---|
| 6,146,168 A | 11/2000 | Ishii | |
| 6,296,492 B1 * | 10/2001 | Fujimoto et al. | 439/63 |
| 6,692,286 B1 | 2/2004 | De Cet | |

(Continued)

FOREIGN PATENT DOCUMENTS

CN 1382316 A 11/2002

(Continued)

OTHER PUBLICATIONS

Official communication issued in the International Application No. PCT/JP2006/311992, mailed on Jul. 18, 2006.

(Continued)

*Primary Examiner*—Elvin G Enad
*Assistant Examiner*—Marina Fishman
(74) *Attorney, Agent, or Firm*—Keating & Bennett, LLP

(57) ABSTRACT

A coaxial connector is connected to a leading end of a coaxial cable and is detachably connected to a receptacle. The coaxial connector includes a cylindrical housing including a spring portion having a projection to be fitted in a groove provided on the outer periphery of an outer conductor of the receptacle, a central conductor probe stored in the housing so as to be in contact with an inner terminal of the receptacle, and cylindrical sleeves held on the outer periphery of the housing so as to be movable in the axial direction. The sleeve has lock pieces provided in an upper portion and an annular portion in a lower portion. The lock pieces are in elastic contact with a first engaging portion and a second engaging portion provided on the outer periphery of the housing. The annular portion restricts expansion of the spring portion of the housing. The annular portion of the sleeve does not restrict the spring portion when detached (position A), and restricts expansion of the spring portion when attached (position B).

11 Claims, 8 Drawing Sheets

U.S. PATENT DOCUMENTS

| | | |
|---|---|---|
| 2001/0027033 A1 | 10/2001 | Fujimoto et al. |
| 2001/0034145 A1 | 10/2001 | Uratani et al. |
| 2003/0092289 A1 | 5/2003 | Otsu |
| 2005/0159022 A1 | 7/2005 | Nagata |

FOREIGN PATENT DOCUMENTS

| | | |
|---|---|---|
| JP | 01-103187 U | 7/1989 |
| JP | 03-002577 U | 1/1991 |
| JP | 10-032042 A | 2/1998 |
| JP | 2000-182718 A | 6/2000 |
| JP | 2000-182720 A | 6/2000 |
| JP | 2001-176612 A | 6/2001 |
| JP | 2001-283952 A | 10/2001 |
| JP | 2001-338721 A | 12/2001 |
| JP | 2001-338733 A | 12/2001 |
| JP | 2001-338734 A | 12/2001 |
| JP | 2002-100442 A | 4/2002 |
| JP | 2003-123910 A | 4/2003 |
| KR | 2003-38505 A | 5/2003 |
| KR | 2005-76652 A | 7/2005 |

OTHER PUBLICATIONS

Official communication issued in counterpart Korean Application No. 10-2007-7023717, mailed on Feb. 25, 2009.

English translation of the official communication issued in counterpart Korean Application No. 10-2007-7023717, mailed on Feb. 25, 2009.

Official communication issued in counterpart Chinese Application No. 200680013263.X, dated Mar. 13, 2009.

* cited by examiner

BEFORE FITTING

DURING FITTING

AFTER FITTING

BEFORE FITTING

AFTER FITTING

COAXIAL CONNECTOR AND MEASURING COAXIAL PROBE

BACKGROUND OF THE INVENTION

1. Field of the Invention

The present invention relates to a coaxial connector, and more particularly, to a coaxial connector and a measuring coaxial probe connected to a leading end of a coaxial cable and detachably connected to a receptacle.

2. Description of the Related Art

A known coaxial connector is described in Japanese Unexamined Patent Application Publication No. H10-32042.

As shown in FIG. 11, the coaxial connector includes a sleeve (a movable member 116 and a coupling nut 117) that holds an outer conductor member 115 from the outside and that is movable in the axial direction.

Unfortunately, the sleeve provided outside the outer conductor member 115 in this coaxial connector is defined by the movable member 116 and the coupling nut 117 that are independently movable, and two coil springs 120 and 121 are provided. The movable member 116 includes a spring portion 116a, and a projection 116b is provided at the leading end of the spring portion 116a. The projection 116b serves as a release portion for a projection 115b, and regulates the projection 115b. Therefore, the number of components is increased, the structure is complicated, and the manufacturing cost is increased. Moreover, the outer size of the leading end portion (projections 115b and 116b) is increased and a sufficient strength cannot be ensured. Accordingly, the coaxial connector is easily deformed and deteriorated by repeating attachment and detachment to and from another connector.

Further, complicated operations are necessary for attachment and detachment to and from another connector. That is, for attachment, the sleeve (movable member 116, coupling nut 117) needs to be moved closer to another connector than the leading-end projection 115b of the outer conductor member 15, to be positioned with the leading end thereof pressed against the connector, and to be moved in the opposite direction so as to press the leading end of the outer conductor member 115 for locking.

SUMMARY OF THE INVENTION

In order to overcome the problems described above, preferred embodiments of the present invention provide a coaxial connector and a measuring coaxial probe that have a simple structure, are easily attached to and detached from a receptacle, and withstand repetitive use.

A coaxial connector according to a preferred embodiment of the present invention is connected to a leading end of a coaxial cable and is detachably connected to a receptacle. The coaxial connector includes a cylindrical housing having a spring portion provided with a projection at a leading end thereof, the projection being to be fitted in a groove provided on an outer peripheral portion of an outer conductor of the receptacle; a cylindrical bushing stored in the housing; a central conductor probe stored in the bushing so as to be in contact with an inner terminal of the receptacle; and a cylindrical sleeve held on an outer peripheral portion of the housing so as to be movable in the axial direction. The sleeve has a lock piece in an upper portion and an annular portion in a lower potion. The lock piece is in elastic contact with the outer peripheral portion of the housing, and the annular portion restricts expansion of the spring portion of the housing. The housing includes a first engaging portion and a second engaging portion arranged with a predetermined space therebetween in the axial direction on the outer peripheral portion of the housing, and the lock piece engages with and disengages from the first and second engaging portions. Before the spring portion of the housing is fitted in the groove of the receptacle, the lock piece of the sleeve is engaged with the first engaging portion, and the annular portion of the sleeve does not restrict the spring portion of the housing. After the spring portion of the housing is fitted in the groove of the receptacle, the lock piece of the sleeve is engaged with the second engaging portion, and the annular portion of the sleeve restricts expansion of the spring portion of the housing.

The coaxial connector according to a preferred embodiment of the present invention has a simple structure in which the sleeve is movable in the axial direction while being in elastic contact with the housing. When the operator simply presses the leading end of the housing against the outer conductor of the receptacle for attachment to the receptacle while pinching the sleeve between the fingers, the leading-end spring portion of the housing is fitted in the groove of the outer conductor, and the sleeve moves so as to engage the lock piece with the second engaging portion, so that a lock state in which the annular portion provided in the lower portion of the sleeve restricts expansion of the leading-end spring portion of the housing is maintained. In contrast, when the operator simply pulls out the sleeve with the fingers for detachment from the receptacle, the lock piece is disengaged from the second engaging portion, and the annular portion of the sleeve removes the restriction on the leading-end spring portion of the housing. Therefore, the leading-end spring portion of the housing is disengaged from the groove of the outer conductor, and the housing is detached from the receptacle. Since the lock piece elastically engages with and disengages from the first engaging portion and the second engaging portion, the user can get a lock feeling.

In the coaxial connector according to a preferred embodiment of the present invention, the lock piece may include a projection provided at the leading end of an elastic piece provided in the sleeve, and the first engaging portion and the second engaging portion may be formed of annular grooves provided on the outer peripheral portion of the housing. Further, the elastic piece may include a plurality of slits extending in the axial direction in the cylindrical sleeve. The lock can be formed with a simple structure.

Preferably, an elastic member is interposed between the housing and the sleeve, and the elastic member biases the sleeve in a direction in which the first engaging portion is engaged with the lock piece. This allows the sleeve to reliably return to its initial position when the coaxial connector is detached from the receptacle.

Alternatively, the sleeve is preferably formed by joining and combining a first sleeve and a second sleeve. The first sleeve includes a lock piece that is in elastic contact with an upper peripheral surface of the housing, and an annular portion that restricts expansion of the spring portion of the housing by contact with an outer peripheral surface of the spring portion. The second sleeve covers an upper portion of the first sleeve and an upper portion of the housing. Since the sleeve is defined by two members, the members can be easily formed in appropriate shapes, and assembly is easy. Further, the second sleeve also functions as an outer case, and protects inner components such as the lock piece.

Preferably, the outer diameter of the first sleeve is smaller than the outer diameter of the second sleeve. Since the first sleeve disposed on the lower side is thin, for example, the sleeve can be inserted in a case of a mobile telephone without forming a large hole in the case. Since the second sleeve disposed on the upper side is thick, the operator can easily pinch the sleeve between the fingers, and this makes attachment and detachment operations easy.

The coaxial connector can be suitably used as a measuring coaxial probe.

According to a preferred embodiment of the present invention, the number of components is small, assembly is easy, and only the sleeve is movable. Therefore, the coaxial connector can be easily attached to and detached from the receptacle, and can withstand repetitive use.

Other features, elements, steps, characteristics and advantages of the present invention will become more apparent from the following detailed description of preferred embodiments of the present invention with reference to the attached drawings.

DETAILED DESCRIPTION OF THE PREFERRED EMBODIMENTS

A coaxial connector and a measuring coaxial probe according to various preferred embodiments of the present invention will be described below with reference to the attached drawings.

First Preferred Embodiment

See FIGS. 1 to 7

Figure 1:
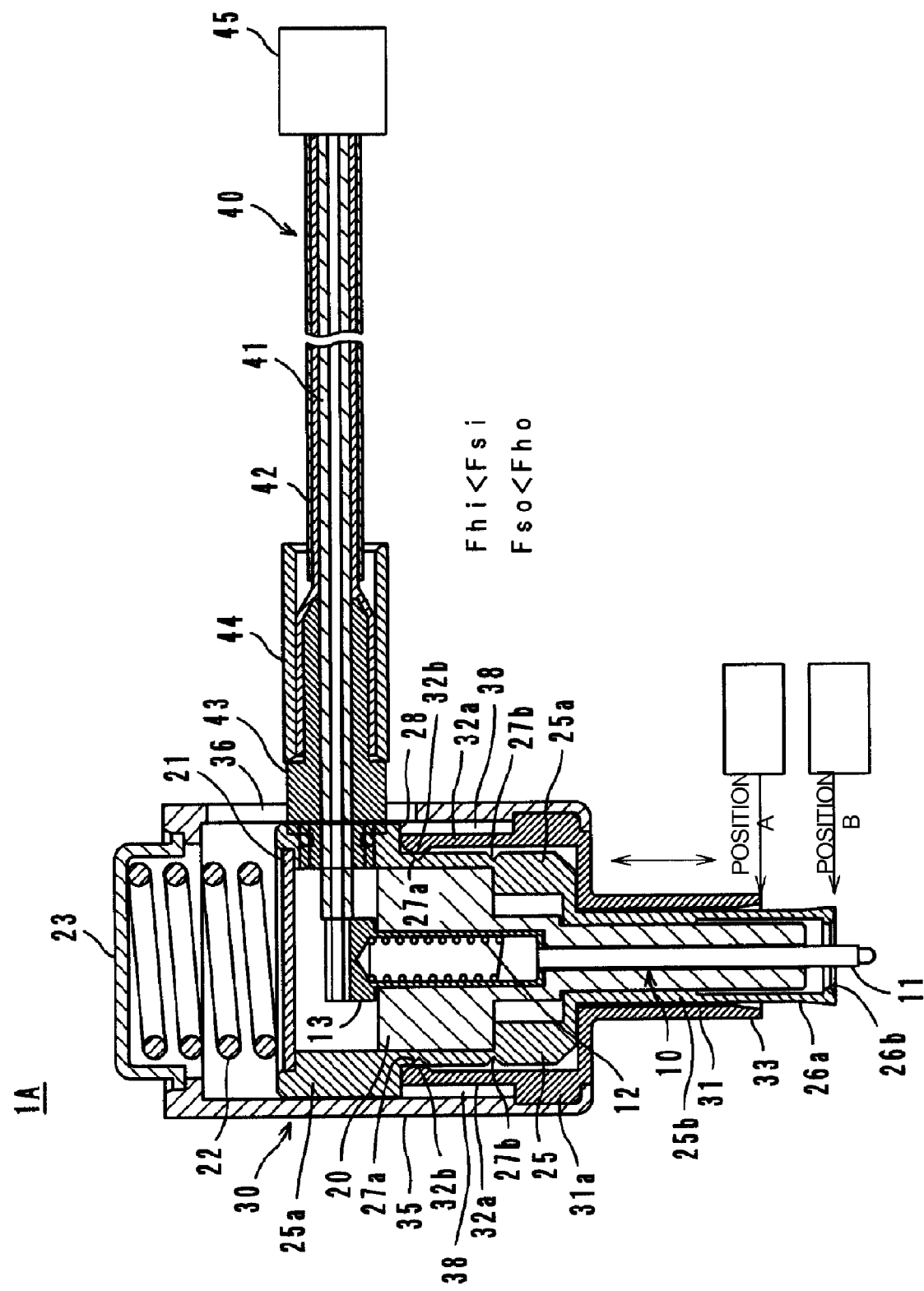
FIG. 1 is a cross-sectional view of a coaxial connector (measuring coaxial probe) according to a first preferred embodiment of the present invention.
Figure 7A:
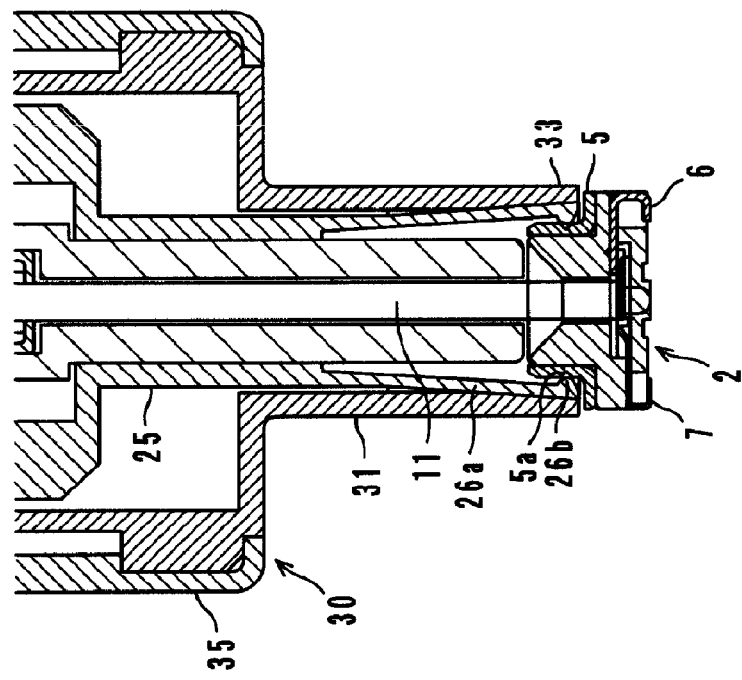
FIGS. 7A-7C include cross-sectional views showing an operation of fitting the measuring coaxial probe in the receptacle.
Figure 7B:
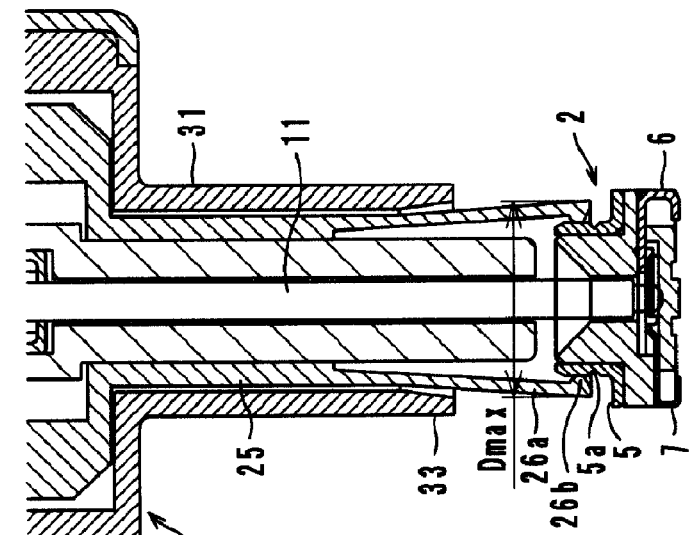
Figure 7C:
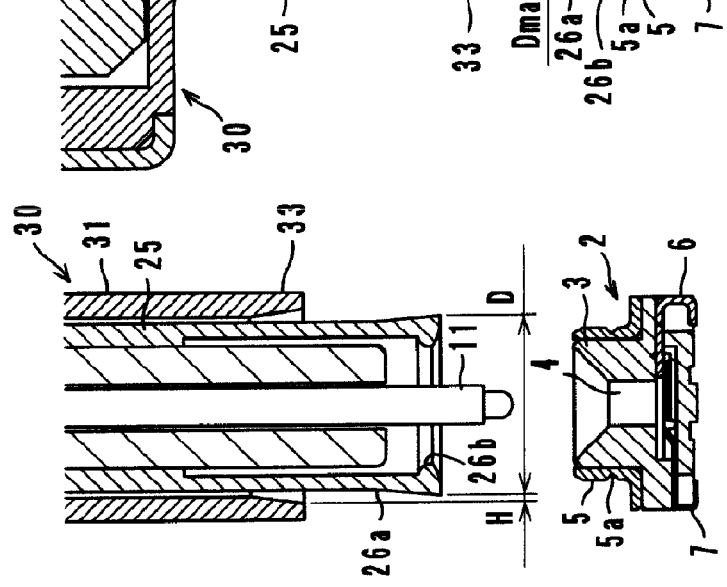

A measuring coaxial probe 1A according to a first preferred embodiment of the present invention includes a central conductor probe 10, a bushing 20, a housing 25, a sleeve 30, a disc 21, a coil spring 22, and a cap 23, as shown in FIG. 1. In a receptacle 2, a case 3 having a center hole 4 is provided with a ground terminal (outer conductor) 5, a first inner terminal 6, and a second inner terminal 7, as shown in FIGS. 7A-7C. The second inner terminal 7 is in elastic contact with the first inner terminal 6 from below. The second inner terminal 7 is in contact with the first inner terminal 6 because of its spring force. When being pressed by a plunger 11 of the measuring coaxial probe 1A, as will be described below, the second inner terminal 7 is bent downward and is separated from the first inner terminal 6.

The central conductor probe 10 includes a plunger 11, a coil spring 12, and a barrel 13 each of which is formed of a conductive material. An upper portion of the plunger 11 is inserted in the barrel 13 from below with the coil spring 12 disposed therebetween.

The housing 25 is preferably substantially cylindrical and formed of a conductive material, and includes a large-diameter upper portion 25a and a small-diameter lower portion 25b. At the leading end of the lower portion 25b, a spring portion 26a is provided. The spring portion 26a includes a projection 26b to be fitted in an annular groove 5a (see FIGS. 7A-7C) provided on the outer periphery of the ground terminal 5 in the receptacle 2. The spring portion 26a is defined by a plurality of slits extending in the axial direction at the leading end of the housing 25, and can be elastically displaced in a direction that is substantially perpendicular to the axial direction. Further, a first engaging portion 27a and a second engaging portion 27b are provided as annular grooves on the outer periphery of the upper portion 25a of the housing 25, and are arranged with a predetermined space therebetween in the axial direction.

The bushing 20 is preferably substantially cylindrical and formed of an insulating material. The central conductor probe 10 is stored in a center hole of the bushing 20. The bushing 20 is stored in a center hole of the housing 25.

The sleeve 30 includes a first sleeve 31 and a second sleeve 35 each preferably being substantially cylindrical and formed of a metal material. A plurality of lock pieces 32a to be in elastic contact with the outer periphery of the housing 25 stand on a flange portion 31a of the first sleeve 31. The lock pieces 32a are defined by a plurality of slits extending in the axial direction in the first sleeve 31, and each lock piece 32a has a projection 32b at its leading end. A small-diameter lower portion of the first sleeve 31 serves as an annular portion 33 having an inner diameter that restricts outward expansion of the leading-end spring portion 26a of the housing 25.

The second sleeve 35 is a cylinder that covers an upper portion of the first sleeve 31 and also covers the upper portion 25a of the housing 25. The second sleeve 35 is joined to and combined with the first sleeve 31 by caulking so that the flange portion 31a of the first sleeve 31 is caught therein. The first sleeve 31 and the second sleeve 35 may be joined together, for example, by bonding or welding, instead of caulking.

Figure 2:
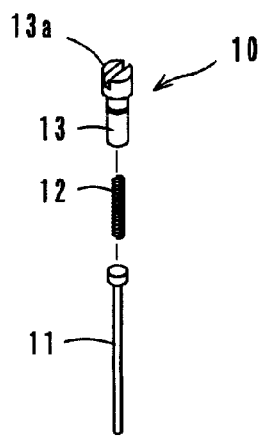
FIG. 2 is a perspective view showing a first assembly step of the measuring coaxial probe.
Figure 3:
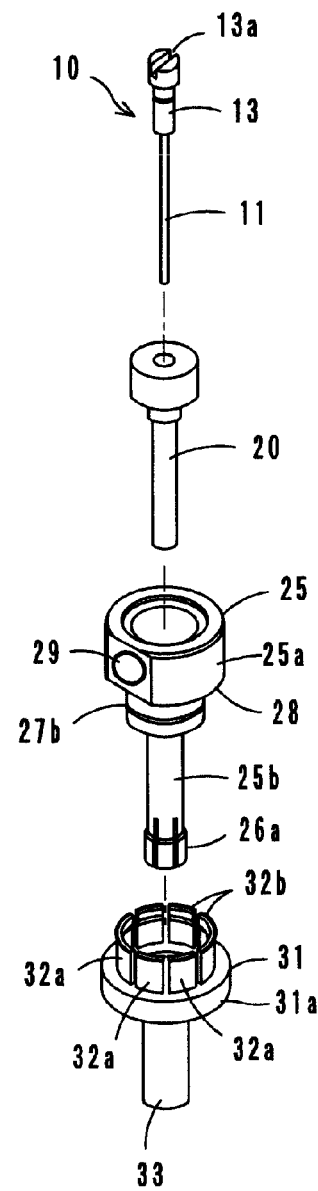
FIG. 3 is a perspective view showing a second assembly step of the measuring coaxial probe.

An assembly procedure for the measuring coaxial probe 1A will now be described with reference to FIGS. 2 to 6. As shown in FIG. 2, the upper portion of the plunger 11 is inserted in the barrel 13 from below with the coil spring 12 disposed therebetween, thereby assembling the central conductor probe 10. Subsequently, as shown in FIG. 3, the central conductor probe 10 is inserted in the center hole of the bushing 20, and the bushing 20 is inserted in the center hole of the housing 25. Further, the housing 25 is inserted in the center hole of the first sleeve 31. The projections 32b of the lock pieces 32a provided in the first sleeve 31 can be elastically fitted in the first engaging portion 27a and the second engaging portion 27b provided on the outer periphery of the housing 25. The housing 25 is inserted until an upper end of the first sleeve 31 comes into contact with a step portion 28. In this case, the projections 32b of the lock pieces 32a are fitted in the first engaging portion 27a. A space 38 (see FIG. 1) in which the lock pieces 32a can be slightly bent outward is provided between an inner peripheral surface of the second sleeve 35 and an outer peripheral surface of the upper portion 25a of the housing 25.

Figure 4:
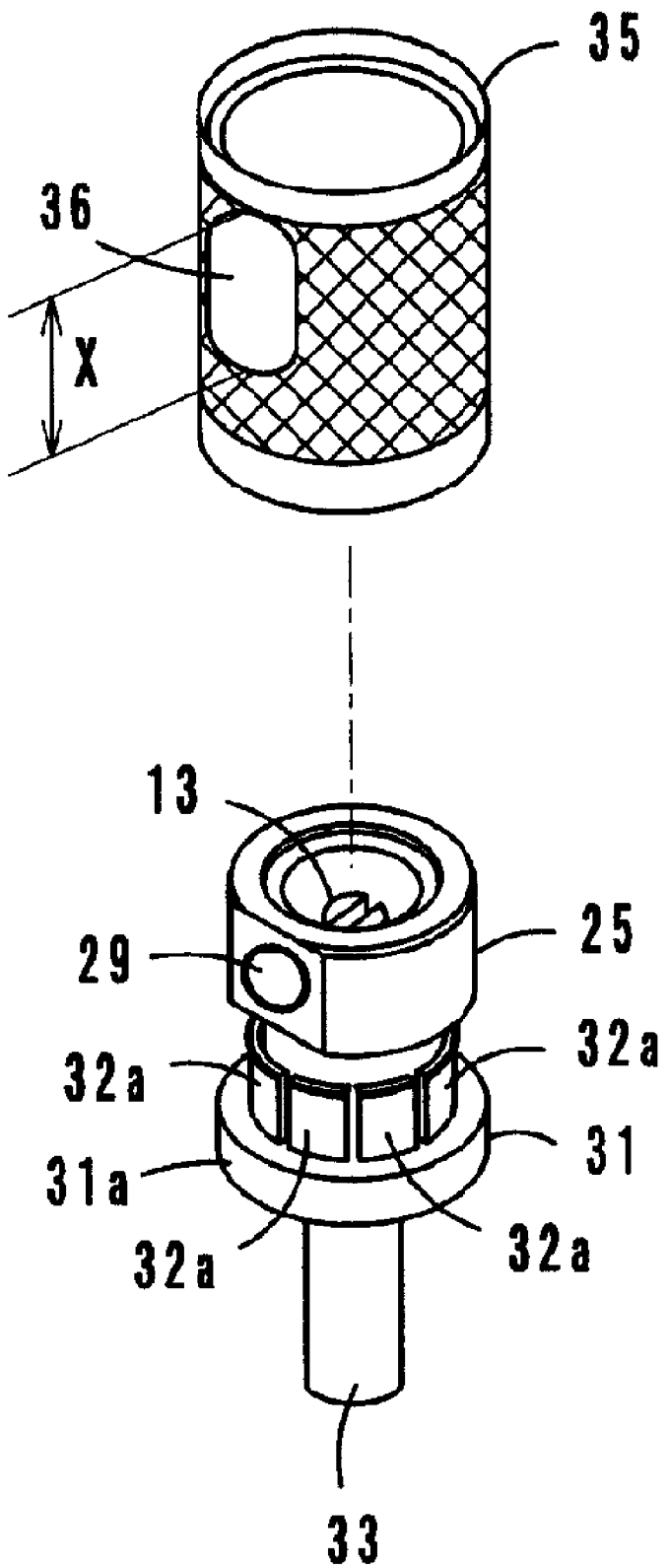
FIG. 4 is a perspective view showing a third assembly step of the measuring coaxial probe.
Figure 5:
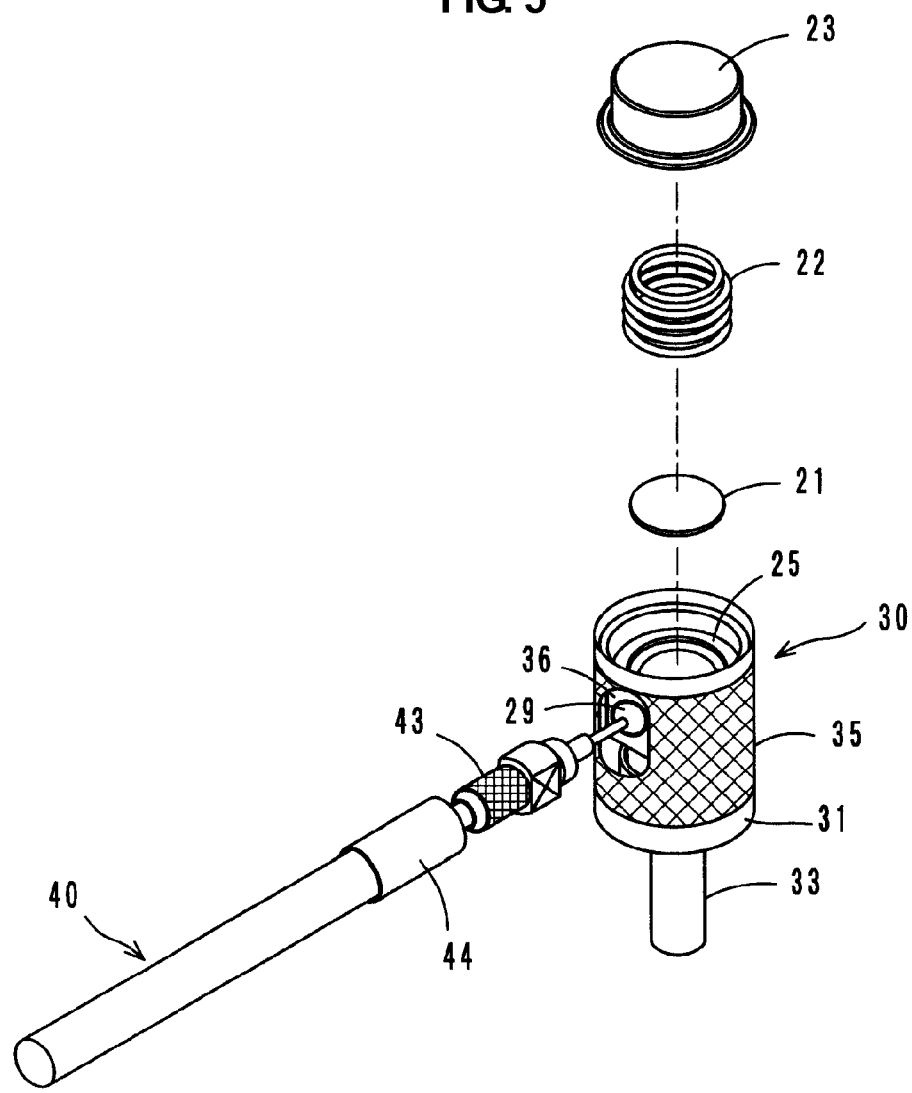
FIG. 5 is a perspective view showing a fourth assembly step of the measuring coaxial probe.

Then, as shown in FIG. 4, the second sleeve 35 is arranged to cover the upper portion 25a of the housing 25 and the lock pieces 32a of the first sleeve 31, and the lower portion of the second sleeve 35 is joined to and combined with the flange portion 31a of the first sleeve 31 by caulking. As shown in FIG. 5, a central conductor 41 (see FIG. 1) of a coaxial cable 40 is inserted in an opening 36 of the second sleeve 35 and an opening 29 of the housing 25, and is soldered to a groove 13a of the barrel 13. The central conductor 41 is thereby electrically connected to the plunger 11 via the barrel 13 and the coil spring 12. An adaptor 43 connected to a shield conductor 42 (see FIG. 1) in the coaxial cable 40 is fitted in the opening 29 of the housing 25, and a ring 44 is mounted on the outer periphery of the adaptor 43 by caulking. The shield conductor 42 is thereby electrically connected to the housing 25 via the adaptor 43. Reference numeral 45 in FIG. 1 denotes a connector for connection to a measuring device (not shown), and the connector is provided at one end of the coaxial cable 40.

Figure 6:
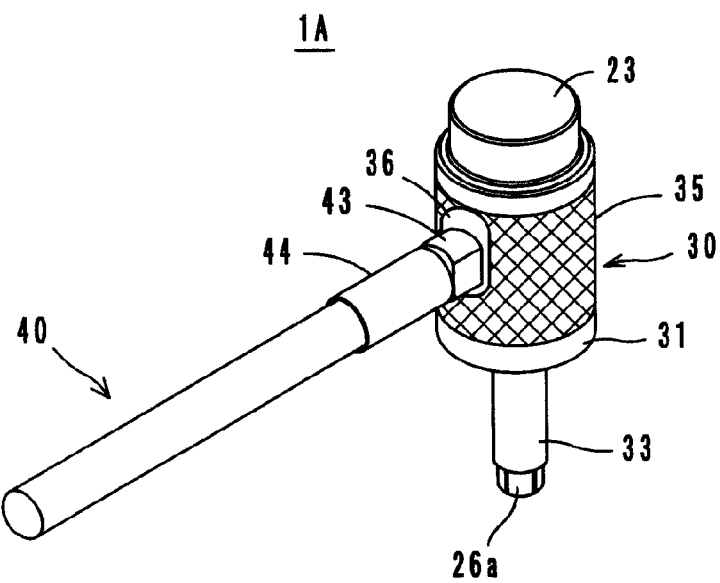
FIG. 6 is a perspective view showing the assembled measuring coaxial probe and a receptacle.

Further, the disc 21 is placed on an upper surface of the housing 25, and the cap 23 is fitted and combined with the top of the second sleeve 35 with the coil spring 22 disposed therebetween. The coil spring 22 elastically presses the housing 25 downward so that the projections 32b of the lock pieces 32a are held engaged with the first engaging portion 27a. Consequently, a state is maintained in which the annular portion 33 of the first sleeve 31 is set at a position A (see FIG. 1) such that the annular portion 33 does not restrict the leading-end spring portion 26a of the housing 25. FIG. 6 shows the finally assembled measuring coaxial probe 1A to which the coaxial cable 40 is connected.

A description will now be given of an operation of attaching the measuring coaxial probe 1A to the receptacle 2 with reference to FIGS. 7A-7C. FIG. 7A shows a state before attachment. As described above, the annular portion 33 of the first sleeve 31 is set at the position A so as not to restrict the leading-end spring portion 26a of the housing 25.

When being press-fitted on an outer peripheral portion of the ground terminal 5 of the receptacle 2, as shown in FIG. 7B, the spring portion 26a of the housing 25 is slightly expanded outward by pressing contact with the outer peripheral portion of the ground terminal 5, and the leading end of the plunger 11 enters the center hole 4 of the case 3 in the receptacle 2. When the housing 25 is further pushed in, as shown in FIG. 7C, the projection 26b is fitted in the annular groove 5a, the leading end of the plunger 11 presses and displaces the second inner terminal 7 downward, so that the second inner terminal 7 comes out of contact with the first inner terminal 6. Consequently, the second inner terminal 7 is electrically connected to the central conductor 41 of the coaxial cable 40 via the plunger 11, the coil spring 12, and the barrel 13. Signal transmission is performed by this route.

When the sleeve 30 is moved downward, the projections 32b of the lock pieces 32a disengage from the first engaging portion 27a, and engage with the second engaging portion 27b. In this case, the annular portion 33 of the first sleeve 31 is set at position B (see FIG. 1) so as to surround the outer periphery of the leading-end spring portion 26a of the housing 25 and to restrict outward expansion of the spring portion 26a. Outward expansion of the leading-end spring portion 26a is thereby restricted, and the spring portion 26a is not disengaged from the groove 5a even when a force acts outward in the radial direction. Moreover, deformation and damage of the spring portion 26a are prevented.

The dimension X (see FIG. 4) of the opening 36 of the second sleeve 35 is set so that the first sleeve 31 and the second sleeve 35 do not interfere with the coaxial cable 40 during movement between the positions A and B.

In order to detach the measuring coaxial probe 1A from the receptacle 2, the above-described procedure is reversed, that is, the outer periphery of the second sleeve 35 is pulled upward while being pinched between the fingers. First, the sleeve 30 is moved upward, the projections 32b of the lock pieces 32a are disengaged from the second engaging portion 27b, and the upper end of the first sleeve 31 comes into contact with the step portion 28 of the housing 25. Then, the projections 32b of the lock pieces 32a are engaged with the first engaging portion 27a, and the annular portion 33 of the first sleeve 31 removes the restriction on the leading-end spring portion 26a of the housing 25. The projection 26b of the leading-end spring portion 26a of the housing 25 is thereby disengaged from the groove 5a of the ground terminal 5 in the receptacle 2. In the receptacle 2, the second inner terminal 7 is displaced upward by its elasticity, and is connected to the first inner terminal 6 again.

As shown in FIGS. 7A-7C, the gap H between the inner diameter of the annular portion 33 and the outer diameter of the leading-end spring portion 26a is set to be smaller than the amount Y of displacement of the leading-end spring portion 26a due to fitting. The displacement amount Y is given by (Dmax-D)/2 where D represents the outer diameter of the leading-end spring portion 26a and Dmax represents the maximum outer diameter of the displaced spring portion 26a.

Regarding the relationship between the force of pressing contact of the lock pieces 32a of the first sleeve 31 with the outer periphery of the housing 25 and the force of pressing contact of the leading-end spring portion 26a of the housing 25 with the outer periphery of the ground terminal 5 in the receptacle 2, the force Fsi for fitting the lock pieces 32a in the first engaging portion 27a is set to be greater than the force Fhi for fitting the leading-end spring portion 26a in the groove 5a, and the force Fho for pulling the leading-end spring portion 26a out from the groove 5a is set to be greater than the force Fso for pulling the lock pieces 32a out from the second engaging portion 27b.

The above-described measuring coaxial probe 1A has a simple structure in which the sleeve 30 is held so as to move relative to the housing 25 in the axial direction. When attaching the measuring coaxial probe 1A to the receptacle 2, the leading-end spring portion 26a of the housing 25 can be fitted in the groove 5a of the ground terminal 5 in the receptacle 2 by simply pressing the leading-end spring portion 26a against the ground terminal 5 while pinching the second sleeve 35 between the fingers. Moreover, when the lock pieces 32a engage with the second engaging portion 27b, the locking state in which the annular portion 33 provided at the bottom of the first sleeve 31 restricts expansion of the leading-end spring portion 26a of the housing 25 is maintained.

For detachment, the lock pieces 32a are disengaged from the second engaging portion 27b by simply pulling out the second sleeve 35 with the fingers, and the annular portion 33 of the first sleeve 31 removes the restriction on the leading-end spring portion 26a of the housing 25. Therefore, the leading-end spring portion 26a of the housing 25 is easily disengaged from the groove 5a of the ground terminal 5.

Since the lock pieces 32a elastically engage with and disengage from the first engaging portion 27a and the second engaging portion 27b, the operator can perceive attachment and detachment to and from the receptacle 2 by a lock feeling of engagement and disengagement. Further, since the spring portion 26a and the lock pieces 32a include a plurality of slits extending in the axial direction in the housing 25 and the first sleeve 31, they can be formed with simple structures.

Since the coil spring 22 is provided between the housing 25 and the second sleeve 35, the sleeve 30 is biased in the direction in which the first engaging portion 27a and the lock pieces 32a are engaged. Therefore, when the measuring coaxial probe 1A is detached from the receptacle 2, the sleeve 30 reliably returns to its initial position. Of course, the spring force of the coil spring 22 is not strong enough to disengage the lock pieces 32a from the second engaging portion 27b during fitting.

Since the sleeve 30 is defined by two members, the first sleeve 31 and the second sleeve 35, the first sleeve 31 and the second sleeve 35 can be easily formed in appropriate shapes, and this facilitates assembly such as connection of the coaxial cable 40. Further, the second sleeve 35 also functions as an outer case, and protects the inner components such as the lock pieces 32a and the housing 25.

Since the outer diameter of the first sleeve 31 is smaller than the outer diameter of the second sleeve 35, for example, the sleeve 30 can be inserted in a case of a mobile telephone without forming a large hole in the case. On the other hand, since the second sleeve 35 disposed on the upper side is thick, it can be easily pinched between the fingers, and attachment and detachment operations are performed easily.

Second Preferred Embodiment

Figure 8A:
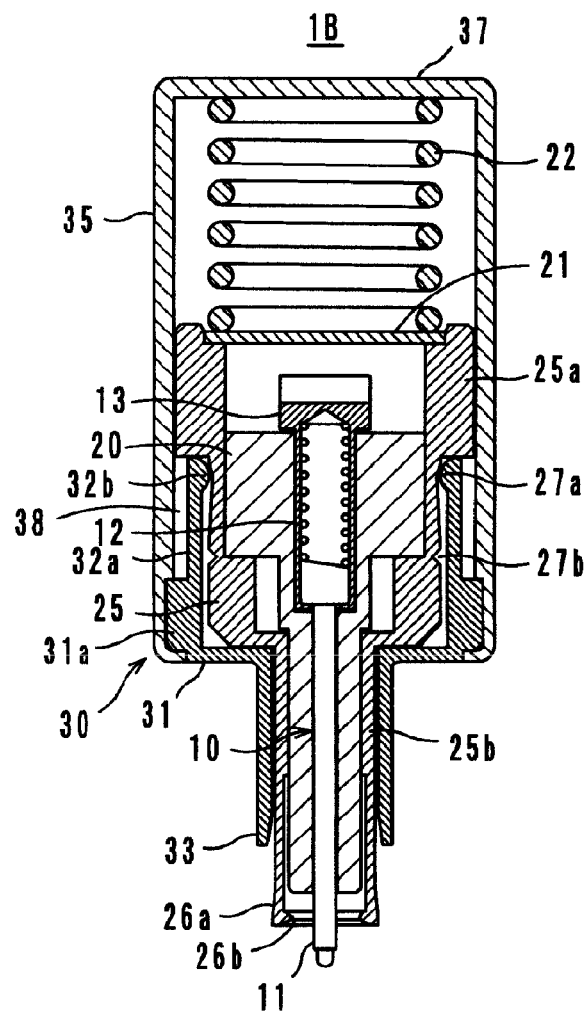
FIGS. 8A and 8B are cross-sectional views respectively showing states in which a coaxial connector (measuring coaxial probe) according to a second preferred embodiment of the present invention is detached from and attached to a receptacle.
Figure 8B:
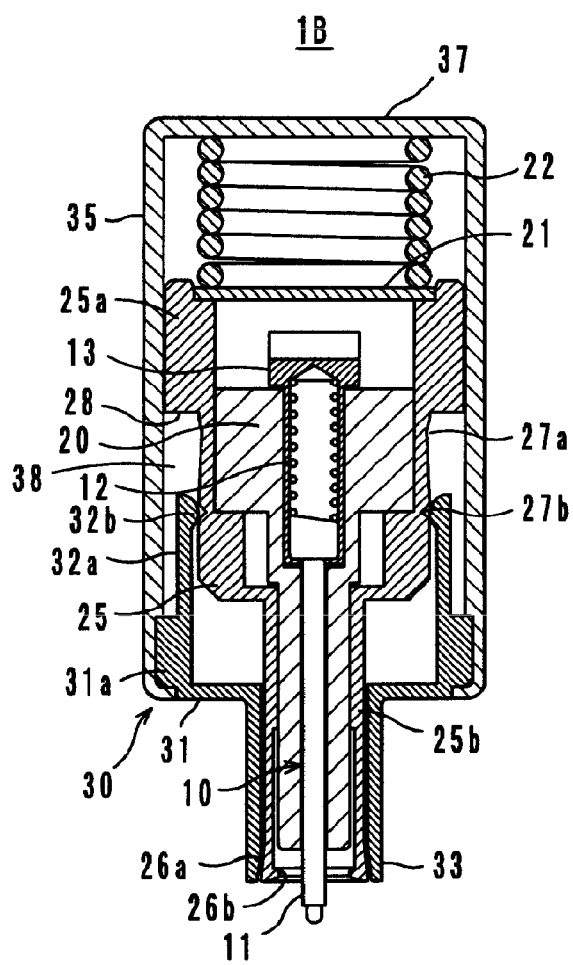

See FIGS. 8A and 8B

FIGS. 8A and 8B show a measuring coaxial probe 1B according to a second preferred embodiment of the present invention. In the measuring coaxial probe 1B, the cap 23 used in the above-described first preferred embodiment is not provided, a ceiling portion 37 is provided in a second sleeve 35, and a coil spring 22 is interposed between the ceiling portion 37 and a disc 21 disposed at an upper end of a housing 25. Other structures, operations, and operational advantages are similar to those adopted in the first preferred embodiment. In FIGS. 8A and 8B, the same components and portions as those in FIG. 1 are denoted by common reference numerals, and redundant descriptions thereof are omitted.

Third Preferred Embodiment

Figure 9:
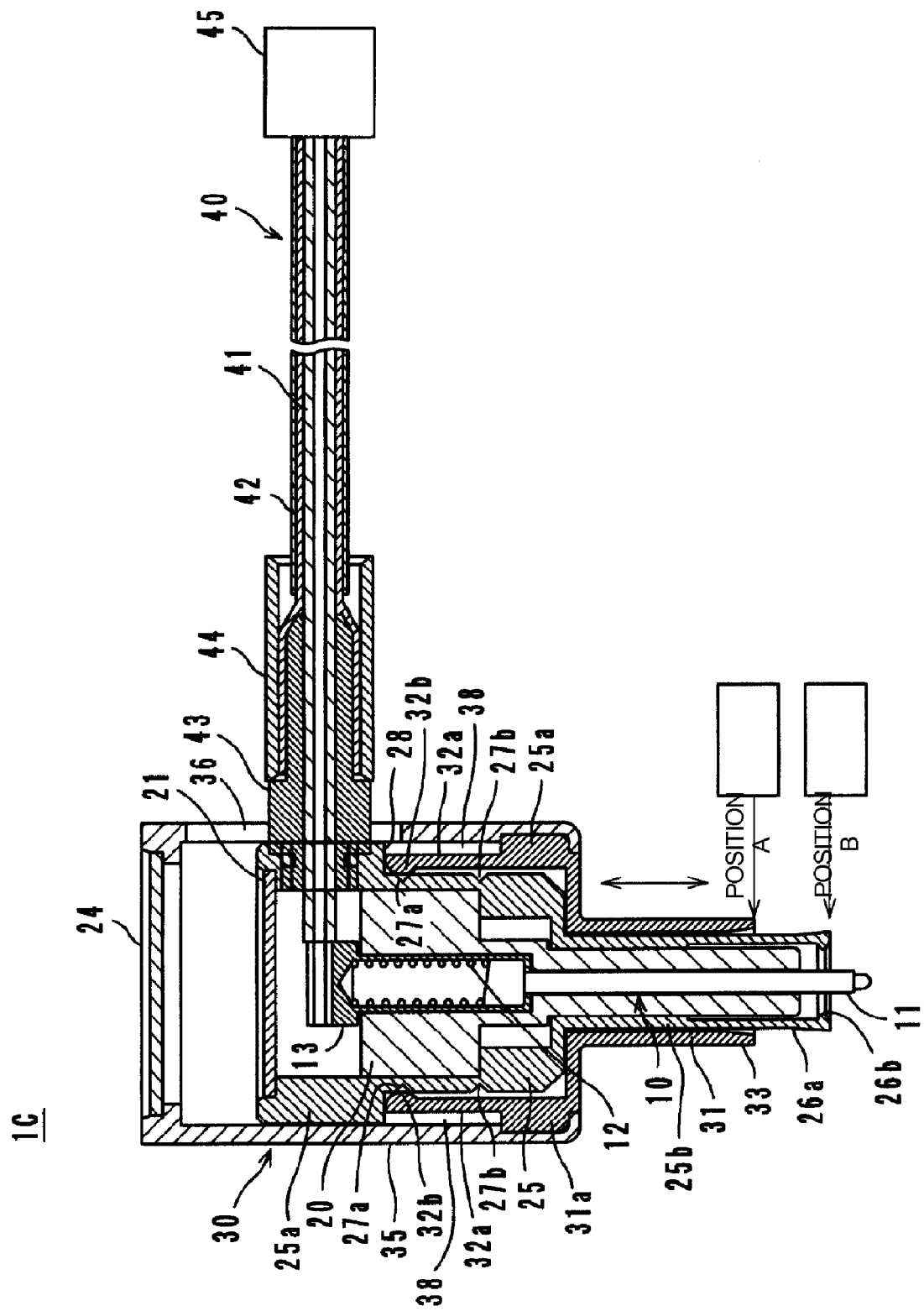
FIG. 9 is a cross-sectional view of a coaxial connector (measuring coaxial probe) according to a third preferred embodiment of the present invention.

See FIG. 9

The coil spring 22 adopted in the first and second preferred embodiments is not indispensable. FIG. 9 shows a measuring coaxial probe 1C according to a third preferred embodiment in which the coil spring 22 is not provided. In this case, an upper end of a second sleeve 35 is simply covered with a cap 24. Other structures, operations, and operational advantages are similar to those adopted in the first preferred embodiment. In FIG. 9, the same components and portions as those in FIG. 1 are denoted by common reference numerals, and redundant descriptions thereof are omitted.

Figure 10:
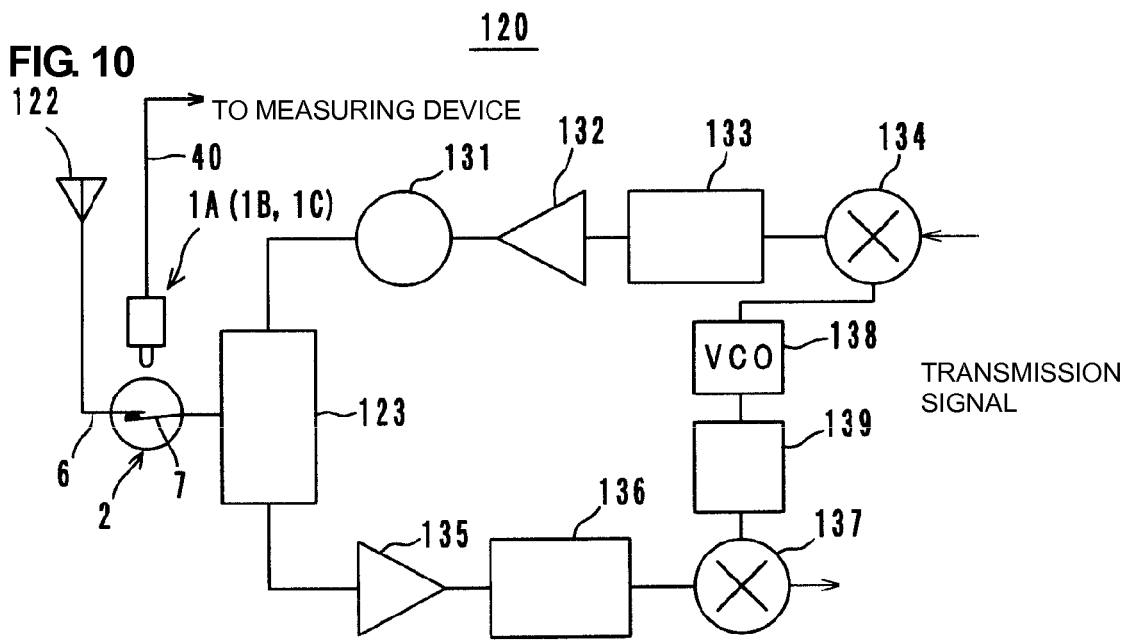
FIG. 10 is a block diagram showing a circuit of a communication device to be measured with the measuring coaxial probe.
Figure 11:
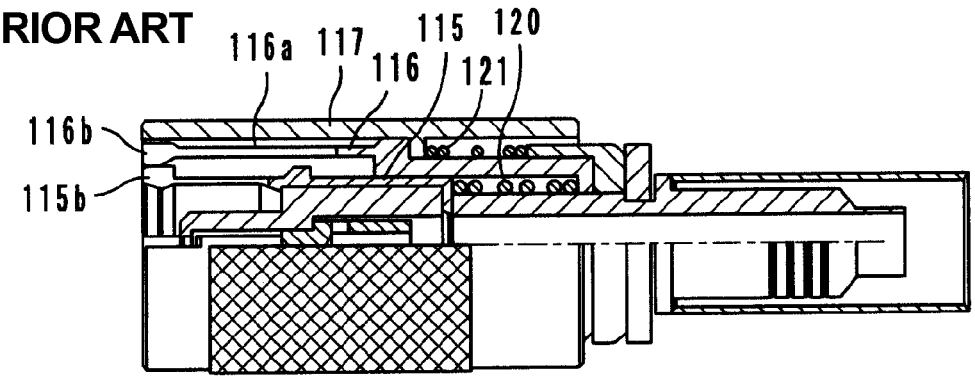
FIG. 11 is a cross-sectional view of a known coaxial connector.

Characteristic Measurement, See FIG. 10

A description will now be given of measurement of the electrical characteristics of a mobile telephone with the measuring coaxial probe. FIG. 10 shows a high-frequency circuit of a mobile telephone 120. The high-frequency circuit includes an antenna element 122, a duplexer 123, a transmission isolator 131, a transmission amplifier 132, a transmission inter-stage bandpass filter 133, and a transmission mixer 134. The high-frequency circuit also includes a receiving amplifier 135, a receiving inter-stage bandpass filter 136, a receiving mixer 137, a voltage-controlled oscillator 138, and a local bandpass filter 139.

A receptacle 2 is interposed between the antenna element 122 and the duplexer 123. By attaching the measuring coaxial probe 1A (1B, 1C) which is connected to a measuring device (not shown) via a coaxial cable 40, electrical characteristics of the high-frequency circuit are checked during the manufacturing process for the mobile telephone 120.

Other Preferred Embodiments

The coaxial connector and the measuring coaxial probe according to the present invention are not limited to the above-described preferred embodiments, and various modifications are possible within the scope of the invention.

In particular, the structure and shape of the receptacle are determined arbitrarily. For example, receptacles disclosed in Japanese Unexamined Patent Application Publication Nos. 2003-123910, 2002-100442, and 2001-176612 can be used. Further, detailed shapes of the housing, the bushing, the central conductor probe, and the sleeve are also determined arbitrarily.

While the present invention is applied to the measuring coaxial probe in the preferred embodiments described above, it is, of course, also applicable to coaxial connectors used for purposes other than measurement.

As described above, various preferred embodiments of the present invention are useful for a coaxial connector and a measuring probe that are connected to the leading end of a coaxial cable and are detachably connected to a receptacle. In particular, the preferred embodiments of the present invention are excellent because of simple structure, easy attachment and detachment to and from the receptacle, and high resistance to repetitive use.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A coaxial connector connected to a leading end of a coaxial cable and detachably connected to a receptacle, the coaxial connector comprising:
   a substantially cylindrical housing including a spring portion having a projection at a leading end thereof, the projection being arranged to be fitted in a groove provided on an outer peripheral portion of an outer conductor of the receptacle;
   a substantially cylindrical bushing stored in the housing;
   a central conductor probe stored in the bushing so as to be in contact with an inner terminal of the receptacle; and
   a substantially cylindrical sleeve held on an outer peripheral portion of the housing so as to be movable in an axial direction; wherein
   the sleeve includes a lock piece in an upper portion and an annular portion in a lower portion, the lock piece is in elastic contact with the outer peripheral portion of the housing, and the annular portion restricts expansion of the spring portion of the housing;
   the housing includes a first engaging portion and a second engaging portion arranged with a predetermined space therebetween in the axial direction on the outer peripheral portion of the housing, and the lock piece engages with and disengages from the first and second engaging portions;

the lock piece of the sleeve is engaged with the first engaging portion and the annular portion of the sleeve does not restrict the spring portion of the housing before the spring portion is fitted in the groove of the receptacle;

the lock piece of the sleeve is engaged with the second engaging portion and the annular portion of the sleeve restricts expansion of the spring portion of the housing after the spring portion is fitted in the groove of the receptacle; and an elastic member is interposed between the housing and the sleeve, and the elastic member biases the sleeve in a direction in which the first engaging portion is engaged with the lock piece.

2. The coaxial connector according to claim 1, wherein the lock piece includes a projection provided at the leading end of an elastic piece provided in the sleeve, and the first engaging portion and the second engaging portion include annular grooves provided on the outer peripheral portion of the housing.

3. The coaxial connector according to claim 2, wherein the elastic piece includes a plurality of slits extending in the axial direction in the substantially cylindrical sleeve.

4. A coaxial connector connected to a leading end of a coaxial cable and detachably connected to a receptacle, the coaxial connector comprising:

a substantially cylindrical housing including a spring portion having a projection at a leading end thereof, the projection being arranged to be fitted in a groove provided on an outer peripheral portion of an outer conductor of the receptacle;

a substantially cylindrical bushing stored in the housing;

a central conductor probe stored in the bushing so as to be in contact with an inner terminal of the receptacle; and a substantially cylindrical sleeve held on an outer peripheral portion of the housing so as to be movable in an axial direction; wherein the sleeve includes a lock piece in an upper portion and an annular portion in a lower portion, the lock piece is in elastic contact with the outer peripheral portion of the housing, and the annular portion restricts expansion of the spring portion of the housing;

the housing includes a first engaging portion and a second engaging portion arranged with a predetermined space therebetween in the axial direction on the outer peripheral portion of the housing, and the lock piece engages with and disengages from the first and second engaging portions;

the lock piece of the sleeve is engaged with the first engaging portion and the annular portion of the sleeve does not restrict the spring portion of the housing before the spring portion is fitted in the groove of the receptacle;

the lock piece of the sleeve is engaged with the second engaging portion and the annular portion of the sleeve restricts expansion of the spring portion of the housing after the spring portion is fitted in the groove of the receptacle; and the sleeve includes a first sleeve and a second sleeve joined to each other, the first sleeve includes a lock piece that is in elastic contact with an upper peripheral surface of the housing, and an annular portion that restricts expansion of the spring portion of the housing by contact with an outer peripheral surface of the spring portion, and the second sleeve covers the upper portion of the first sleeve and an upper portion of the housing.

5. The coaxial connector according to claim 4, wherein the outer diameter of the first sleeve is smaller than the outer diameter of the second sleeve.

6. The coaxial connector according to claim 1, further comprising a coaxial cable including an inner conductor and a shield conductor, wherein the inner conductor is connected to the central conductor probe, and the shield conductor is connected to the housing.

7. A measuring coaxial probe including the coaxial connector according to claim 1, wherein the measuring coaxial probe is detachably connected to the receptacle which has a switch ON/OFF function.

8. The coaxial connector according to claim 4, wherein the lock piece includes a projection provided at the leading end of an elastic piece provided in the sleeve, and the first engaging portion and the second engaging portion include annular grooves provided on the outer peripheral portion of the housing.

9. The coaxial connector according to claim 8, wherein the elastic piece includes a plurality of slits extending in the axial direction in the substantially cylindrical sleeve.

10. The coaxial connector according to claim 4, further comprising a coaxial cable including an inner conductor and a shield conductor, wherein the inner conductor is connected to the central conductor probe, and the shield conductor is connected to the housing.

11. A measuring coaxial probe including the coaxial connector according to claim 4, wherein the measuring coaxial probe is detachably connected to the receptacle which has a switch ON/OFF function.

* * * * *